United States Patent
Clark

(10) Patent No.: US 11,462,414 B2
(45) Date of Patent: Oct. 4, 2022

(54) ATOMIC LAYER ETCHING OF METAL OXIDES

(71) Applicant: Tokyo Electron Limited, Tokyo (JP)

(72) Inventor: Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/194,421

(22) Filed: Mar. 8, 2021

(65) Prior Publication Data

US 2022/0285163 A1 Sep. 8, 2022

(51) Int. Cl.
*H01L 21/3065* (2006.01)
*H01J 37/305* (2006.01)
*H01J 37/32* (2006.01)

(52) U.S. Cl.
CPC ...... *H01L 21/3065* (2013.01); *H01J 37/3053* (2013.01); *H01J 37/32009* (2013.01)

(58) Field of Classification Search
CPC ............. H01L 21/3065; H01J 37/3053; H01J 37/32009
See application file for complete search history.

(56) References Cited

U.S. PATENT DOCUMENTS

| | | | |
|---|---|---|---|
| 10,283,369 B2 | 5/2019 | Clark et al. | |
| 10,381,227 B2 * | 8/2019 | George | H01L 29/517 |
| 10,790,156 B2 | 9/2020 | Clark et al. | |
| 2015/0270140 A1 * | 9/2015 | Gupta | H01L 21/32136 216/67 |
| 2016/0111294 A1 * | 4/2016 | Berry, III | H01L 29/66742 438/157 |
| 2018/0163312 A1 * | 6/2018 | Blomberg | C09K 13/10 |
| 2020/0144074 A1 * | 5/2020 | Adermann | C23F 1/02 |
| 2020/0312670 A1 * | 10/2020 | Smith | H01J 37/32899 |
| 2020/0395222 A1 * | 12/2020 | Woods | H01L 21/0206 |
| 2021/0305058 A1 * | 9/2021 | Ogawa | H01L 21/31122 |

OTHER PUBLICATIONS

Min, K.S., et al. "Atomic Layer Etching of Al2O3 Using BCl3/Ar for the Interface Passivation Layer of III-V MOS Devices." Microelectronic Engineering, vol. 110, 2013, pp. 457-460., doi:10.1016/j.mee.2013.03.170.

Lee, Younghee, et al. "Trimethylaluminum as the Metal Precursor for the Atomic Layer Etching of Al2O3 Using Sequential, Self-Limiting Thermal Reactions." Chemistry of Materials, vol. 28, No. 9, 2016, pp. 2994-3003., doi:10.1021/acs.chemmater.6b00111.

Lemaire, Paul C., and Gregory N. Parsons. "Thermal Selective Vapor Etching of TiO2: Chemical Vapor Etching via WF6 and Self-Limiting Atomic Layer Etching Using WF6 and BCl3." Chemistry of Materials, vol. 29, No. 16, 2017, pp. 6653-6665., doi:10.1021/acs.chemmater.7b00985.

* cited by examiner

*Primary Examiner* — Binh X Tran

(74) *Attorney, Agent, or Firm* — Slater Matsil, LLP

(57) ABSTRACT

In one example, a method of processing a substrate includes loading the substrate in a process chamber, where the substrate includes a metal oxide containing film to be etched. The method further includes performing of an atomic layer etching including a plurality of cyclic processes, each of the plurality of cyclic processes including exposing the metal oxide containing film to a first gas stream including boron trichloride ($BCl_3$), and exposing the metal oxide containing film to a second gas stream including borane, amine, alcohol, carboxylic acid, carboxamide, or beta-diketone reagent.

21 Claims, 7 Drawing Sheets

ATOMIC LAYER ETCHING OF METAL OXIDES

TECHNICAL FIELD

The present invention relates generally to semiconductor fabrication, and in particular embodiments, to methods of atomic layer etching for metal oxides.

BACKGROUND

An integrated circuit (IC) is a set of electronic circuits comprising components such as transistor, resistor, and capacitor, on a small chip of semiconductor material. ICs are found essentially in all modern electronics, and the fabrication technology for IC devices is of paramount importance in their commercial manufacturing processes. Etching, a process to remove some portion of a thin film or a substrate, is one of the key processes in such semiconductor device fabrication. In the modern semiconductor industry, etching is typically performed by wet etching using liquid etchants or dry etching such as reactive ion etching.

As an IC's critical dimension and feature size has shrunk below 10 nm, the semiconductor industry requires increased precision in dimensions (e.g., linewidths, etch depth, and film thicknesses) during etching processes. For example, atomic scale controllability below 0.5 nm may be necessary, which is difficult to realize with conventional etching technology. For this reason, alternative etching techniques that meet such requirements are highly desired.

Atomic layer etching (ALE) is a new technique that may offer such atomic-scale control and currently under development. ALE removes a thin film or substrate materials from a surface using sequential self-limited half reactions to achieve precise control of the etch depth. A typical ALE process consists of one or more cycles of two self-limiting half reactions: (1) surface modification by adsorption of a precursor vapor to form a thin layer as an intermediate and (2) removal of at least a portion of the formed layer as a gaseous product. In other words, the ALE process chemically converts a solid material in a layer by layer fashion to create products with higher volatility that can be removed into a gas phase. These reactions are considered "self-limiting" because the surface reactions are limited to a moderate layer thickness by diffusion, by the sparsity of new reaction sites, by the amount of modified surface material, or by some other means; and thereby, the reactions stop when the accessible reactive surface species are depleted, modified or removed.

With its capability of atomic-scale control, ALE technology offers a great potential in applications such as microelectronics, optoelectronics, micro-electro-mechanical systems (MEMS), and other semiconductor devices. However, ALE is still in an early stage of development compared to conventional etching technologies and atomic layer deposition techniques. Effective ALE precursor and surface chemistry for each process step need to be further developed together with better understanding of the reaction mechanisms. In addition, conventional ALE processes have low etching rates, long cycling times, low throughput and higher costs that hinder adoption in industrial applications.

SUMMARY

A method of processing a substrate includes loading the substrate in a process chamber, where the substrate includes a metal oxide containing film to be etched. The method further includes performing of an atomic layer etching including a plurality of cyclic processes, each of the plurality of cyclic processes including exposing the metal oxide containing film to a first gas stream including boron trichloride (BCl3), and exposing the metal oxide containing film to a second gas stream including a borane reagent or an amine reagent.

A method of atomic layer etching (ALE) includes loading a substrate in a process chamber, the substrate including a metal oxide containing film to be etched. The method further includes exposing the substrate to a first gas stream including boron trichloride (BCl3) in a vapor phase; and exposing the substrate to a second gas stream including an alcohol, carboxylic acid, a carboxamide, or beta-diketone reagent.

A method of processing a substrate includes loading the substrate in a process chamber, the substrate including a metal oxide containing film to be etched. The method further includes performing of a sequential etching process including a plurality of self-limiting cyclic processes, each of the plurality of self-limiting cyclic processes including converting a layer of the metal oxide containing film to a metal mixed-anion compounds including chlorine, and releasing the metal mixed-anion compounds from the rest of the metal oxide containing film to remove the layer of the metal oxide, the releasing including exposing the metal mixed-anion compounds to a first gas stream including an adduct of aluminum hydride with a nitrogen containing adduct ligand, a borane reagent, an amine reagent, a beta-diketone reagent, an alcohol, or a carboxylic acid.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C schematically illustrate a cross sectional view of a substrate at different stages during a thermal ALE process in accordance with an embodiment, wherein FIG. 1A illustrates the substrate prior to the ALE process, FIG. 1B illustrates the substrate during a surface modification step, and FIG. 1C illustrates the substrate during a removal step;

DETAILED DESCRIPTION OF ILLUSTRATIVE EMBODIMENTS

Figure 1A:
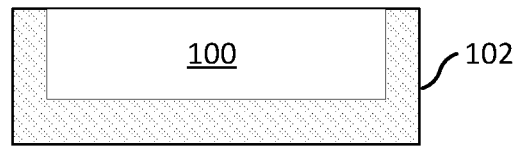

At each successive technology node, the semiconductor industry has improved the IC component packing density. This improvement is followed by an urgent demand for precise atomic-scale control in etching process. Atomic Layer Etching (ALE) is a promising candidate offering precision atomic control below sub-nm. ALE is a film etching technique that consists of sequential self-limiting reactions. The first step modifies the surface by adsorption of a precursor vapor to form a thin layer. The second step is removal of at least a portion of the formed layer. The concept of ALE is analogous to atomic layer deposition (ALD). The difference is that during the second step of ALE, material is removed instead of being added as in ALD. Each step is self-limiting, and only a thin layer is removed by one cycle of ALE process. To achieve a desired amount of etching, steps are typically repeated and so an ALE process generally refers to the sequential cycles of such steps.

There are different approaches to perform these steps. For example, one of the steps or both can be performed using plasma treatments (plasma ALE) to substantially energize the particles that interact with the surface. With using energized particles, plasma ALE generally induces sputtering. This sputtering in plasma ALE enables anisotropic etching, which is a major advantage of plasma ALE. When no plasma is used in either step, it is called thermal ALE. Thermal ALE is characterized with its conformal and isotropic etching as well as little to no damage to the underlying film.

Embodiments described in this disclosure provide an isotropic thermal ALE process for a substrate comprising a metal oxide. Plasma, however, may also be used in certain embodiments to enhance the ALE process efficiency.

ALE has been demonstrated in research for etching different materials such as Si, W, metal oxides (e.g., $Al_2O_3$, $HfO_2$, $ZrO_2$, ZnO, $TiO_2$, $SiO_2$, and $WO_3$), metal nitrides (e.g., $Si_3N_4$, GaN, TiN, AlN), and metal fluorides (e.g., $AlF_3$). The inventor of this application has identified that these prior art techniques are based on a fluorination chemistry. HF has been dominantly used in known ALE techniques, while other reagents such as $SF_4$, $F_2$, $WF_6$, and $XeF_2$ have been proposed as alternative, stronger fluorination reagents. In these prior art techniques, in the first step, the metal species are first fluorinated to form a metal fluoride or the like (e.g., oxyfluoride), which is then removed in the second step of the ALE process based on a ligand-exchange reaction. However, most metal fluorides may have a relatively low volatility, and thereby leading to a slow etch rate. In addition, this leads to the necessity of using higher temperature and a gaseous fluoride containing species during the process, which are often detrimental or damaging to other materials that are being exposed.

Therefore, existing ALE techniques using fluorination chemistry may be undesirable for selective etching of metal oxide, in particular non-silicon materials which has less reactivity with fluorine than silicon. Furthermore, in semiconductor industry, new interconnect and contact schemes may introduce films that are sensitive to fluorine-based chemistries. Embodiments of the present application describe ALE techniques that do not rely on fluorination and overcome the above issues.

In addition, increasingly, novel processing is being introduced into the fabrication flow that may need etching of various non-silicon metal oxides. For example, high-k dielectric materials with metal oxide such as aluminum oxide, hafnium oxide, and zirconium oxide may need to be etched with precision.

Various embodiments described herein may be applied to fabricate self-aligned contacts (SAC), ultra-thin gate dielectrics, ultra-thin channels, novel field-effect transistors (FET) architecture such as fin field-effect transistors (FinFET) and Gate-All-Around transistors, which require near-atomic scale etching control and selectivity.

More specifically, embodiments of the present disclosure describe atomic layer etching processes based on chlorination instead of fluorination. In various embodiments, $BCl_3$ is used as a precursor to covert a metal oxide layer on a surface of the substrate to an oxychloride layer by partially removing oxygen from the metal oxide into a gas phase. In the following removal step, the oxychloride layer is exposed to a ligand-exchange reagent, and at least a portion of the oxychloride layer is converted to volatile products that escape to a gas phase.

The chlorination based ALE method described in various embodiments of this disclosure may be advantageous in providing a greater etch rate of the target material while preventing undesired etching of other materials. For example, embodiments of the ALE methods may be used in selective etching of aluminum oxide on silicon, where the aluminum oxide is removed without damaging the silicon surface.

Additionally, the ALE method described in various embodiments of this disclosure recites the use of various ligand-exchange reagents different from, and typically more volatile than, conventional reagents such as tin(II) acetylacetonate ($Sn(acac)_2$) and trimethylaluminum (TMA). The ligand-exchange reagents, which are described further below in more detail, may comprise a borane reagent, an amine reagent, an alcohol reagent, a carboxylic acid, a carboxamide, a beta-diketone, or an adduct of aluminum hydride with a nitrogen containing adduct ligand.

In various embodiments, the method comprises a set of, or cycles of treatment steps comprising a surface modification step and a surface removal step. The surface modification step comprises exposing the metal oxide containing film to a first gas stream comprising boron trichloride ($BCl_3$). The surface removal step comprises exposing the metal oxide containing film to a second gas stream comprising a ligand-exchange reagent. While $BCl_3$ is the primary reagent in the surface modification step, a variety of ligand-exchange reagents may be used according to various embodiments of this disclosure. Example methods and systems of this disclosure will be described in more detail below in various embodiments.

In the following, an ALE process in accordance with an embodiment of the disclosure is first described in FIG. 1A-1C, followed by the illustrations of various examples of the embodiments with different ligand-exchange reagents in FIGS. 2-4. In FIG. 5, a general embodiment process flow of ALE process is then described. Further, embodiments of ALE processing tools will be described in FIG. 6 and FIG. 7.

Figure 1B:
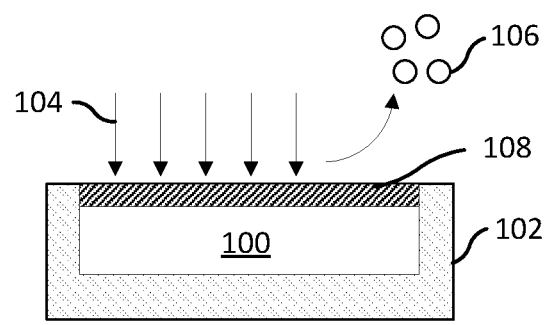
Figure 1C:
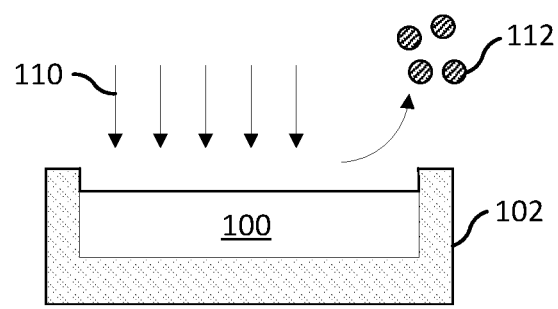

FIG. 1A-1C illustrates a cross-sectional view of a substrate comprising a metal oxide at different stages during an atomic layer etching (ALE) process in accordance with an embodiment of the disclosure.

FIG. 1A illustrates a substrate 102 prior to the ALE process. The substrate 102 may comprise a bulk silicon wafer, silicon on insulator (SOI) wafer, silicon carbide, and other substrate material, and may comprise layers of semiconductors useful in various nanodevices including epitaxial silicon, silicon germanium, silicon carbon, gallium nitride, gallium arsenide, indium phosphide, gallium phosphide, indium antimonide, and others. At this stage, in certain embodiments, the substrate 102 may have already undergone various steps of semiconductor fabrication including the forming of active regions and isolation regions.

As further illustrated in FIG. 1A, the substrate 102 comprises a metal oxide containing film 100 that is to be etched. In various embodiments, the metal oxide containing film 100 may be any film comprising a metal oxide. In various embodiments, the metal oxide containing film 100 may comprise aluminum oxide, titanium oxide, hafnium oxide, zirconium oxide, yttrium oxide, lanthanum oxide, lutetium oxide, tantalum oxide, copper oxide, ruthenium oxide, cobalt oxide, niobium oxide, tungsten oxide, molybdenum oxide, scandium oxide, and combinations thereof.

In various embodiments, the metal oxide containing film 100 may be protruding out of the major surface of the substrate 102 or coplanar with the major surface of the substrate 102. In various embodiments, the metal oxide containing film 100 may have a thickness of about 1 nm to 10 nm, and in different embodiment 10 nm to 100 nm. In various embodiments, the metal oxide containing film 100 may cover substantially all of the major surface of the substrate 102. In certain embodiments, the metal oxide containing film 100 may be patterned and may cover a fraction of the major surface of the substrate 102. In such embodiments, the patterned metal oxide containing film 100 may include a number of islands of regions spaced by portions of the substrate 102.

Prior to the start of the cyclic etch process, the surface may be prepared by pre-cleaning treatments to remove hydrocarbons and other particles or contaminants such as metal or salt impurities from the surface. For example, this process may include wet-chemistry based techniques of exposing the substrate to deionized water followed by different solutions comprising chemicals such as hydrochloric acid, hydrogen peroxide, ammonia water, and Piranha solution. These chemicals are thoroughly rinsed and the substrate may be dried with a variety of procedures. Despite pre-cleaning treatments, in general, hydroxyl groups may be present on the treated surface of metal oxide.

Further, in certain embodiments, the process chamber may also be purged or evacuated to remove contaminants or other materials that may contaminate the surfaces being cleaned or consume the reactants being introduced.

In various embodiments, the substrate 102 may be heated to bring the metal oxide containing film 100 to a temperature amenable for etching. The temperature may be controlled resistively using proportional-integral-derivative (PID) controllers. In certain embodiments, thermal equilibrium may be reached by flowing an inert carrier gas such as helium (He), argon (Ar), and nitrogen ($N_2$), for 30 min or longer prior to the first step of the ALE process. In various embodiments, the peak heating temperature may be between 25° C. and 600° C. In certain embodiments, the peak heating temperature may be between 100° C. and 400° C., or between 100° C. and 250° C.

In certain embodiments, individual steps of the ALE process may be carried out under a reduced pressure. In other words, the process chamber may be maintained at a reduced pressure, for example, the pressure may be kept between 10 Torr and 40 Torr. In further examples, the pressure within the process chamber may be between 0.1 Torr and 20 Torr, or between $10^{-5}$ Torr and 1 Torr.

FIGS. 1B and 1C illustrate the steps of the ALE process. Specifically, FIG. 1B illustrates the substrate 102 after the first step of the ALE process and FIG. 1C illustrates the substrate 102 after the second step of the ALE process.

Referring to FIG. 1B, in a first step, the substrate 100 is first exposed to a gas stream comprising a $BCl_3$ vapor 104. This first step may also be referred as a surface modification step. In certain embodiments, the gas stream may further comprise an inert carrier gas such as helium (He), argon (Ar), and nitrogen ($N_2$), at any ratio. In various embodiments, the chamber may be first filled with a flow of inert gas, and then the reagent comprising $BCl_3$ may be sequentially supplied as pulses to the inert carrier flow. In one embodiment, the pulse sequence of the reagent and the inert gas may be at a ratio of about 1:1 to about 1:5, for example, 1:3 in one embodiment, where the reagent comprising $BCl_3$ is pulsed 1 sec after every 3 sec giving a ratio of 1:3. In certain embodiments, the duration of exposure to the reagent comprising $BCl_3$ in a pulse or step may be between about 0.1 and 600 sec. In certain embodiments, the gas stream may further comprise an oxidative gas such as oxygen and ozone mixed in the flow at any ratio. This addition may be beneficial in case of etching non-oxide materials (e.g., W), where the target material may be partially oxidized to an oxide that may be easier to etch in the second step than the initial state. In other embodiments, a separate oxidation step comprising exposing the substrate to a gas stream comprising an oxidative gas may be performed as a pretreatment step before the exposure to the first gas stream.

The exposure to the vapor 104 comprising $BCl_3$ induces chlorination reaction on the surface, and a thin layer of metal oxychloride 108 is formed on the surface along with volatile byproducts comprising boron oxychloride 106. The volatile byproducts comprising boron oxychloride 106 are removed from the surface concurrently or during subsequent processing, for example, during a subsequent purge/evacuation step, or an optional plasma treatment step as described below. Not intending to be limiting in any sense, this illustration describes an example of embodiments where the gas introduced by the exposure 104 selectively reacts with the metal oxide containing film 100 but not with the non-metal oxide portion of substrate 102.

In certain embodiments, after exposing to the vapor 104 comprising $BCl_3$ 104, the process chamber holding the substrate 102 may be purged with an inert gas. In a purge process, the substrate 102 may be exposed to a stream of inert gas such as helium (He), argon (Ar), or nitrogen ($N_2$), so as to remove any of the vapor 104 comprising $BCl_3$. In some embodiments, the process chamber may be evacuated instead of purging. Still in certain embodiments, both purging and evacuation may be performed. This prevents the restarting of the chlorination process until the next cycle of the ALE process. In addition, the purge/evacuation process may remove the volatile byproducts 106 comprising boron oxychloride. In certain embodiments, the duration of purge/evacuation process may be between 0.5 sec and 300 sec.

In certain embodiments, an optional treatment with plasma may be performed after exposing to the vapor 104 comprising $BCl_3$ 104 as a part of the ALE process in order to dissociate surface species from the substrate by ion bombardment. The plasma treatment includes exposing the substrate to a gas containing plasma, which may comprise ionized inert gas molecules of helium (He), argon (Ar), or nitrogen ($N_2$). The system may be heated or cooled during the plasma treatment step. The plasma treatment may also be carried out under at a reduced pressure, wherein the pressure may be kept between 10 Torr and 40 Torr, between 0.1 Torr and 20 Torr, or between $10^{-5}$ Torr and 1 Torr.

Next, FIG. 1C illustrates the surface during the removal step during which the substrate 102 is exposed to a gas stream 10 comprising a reagent to induce a ligand-exchange reaction. In certain embodiments, the gas stream may further comprise an inert carrier gas such as helium (He), argon (Ar), and nitrogen ($N_2$), at any ratio. In various embodiments, the chamber may be first filled with a flow of inert gas, and then the reagent for ligand-exchange reaction may be sequentially supplied as pulses to the inert carrier flow. In one embodiment, the pulse sequence may be at a ratio of 1/3 sec, where the reagent is pulsed 1 sec after every 3 sec. In certain embodiments, the duration of exposure to the reagent in a pulse or step may be between 0.1 and 600 sec.

In certain embodiments, the substrate 102 is heated while being exposed to a gas stream 110 comprising a reagent. This may be a continuation of the previous heating process. In certain embodiments, a targeted heating pulse may be provided, for example, from a lamp. This may be performed to control the process temperature, which would control the reaction rates and therefore the efficiency of the etching process. In various embodiments, the temperature at the substrate 102 may be targeted to be between 25° C. and 600° C., and in certain embodiments between 100° C. and 400° C., or between 150° C. and 300° C.

In certain embodiments, the exposure to the gas stream 110 comprising the reagent may be carried out under a reduced pressure. In other words, the process chamber may be maintained at a reduced pressure, for example, the pressure may be kept between 10 Torr and 40 Torr, and in certain embodiments, between 0.1 Torr and 20 Torr, or between $10^{-5}$ Torr and 1 Torr.

The ligand-exchange reaction in this removal step converts at least a portion of the layer of metal oxychloride 108 formed during the surface modification step to more volatile products 112. The volatile products 112 thus formed may desorb from the surface. In various embodiments, the volatile products may be removed during the removal step, a subsequent purge/evacuation step, or an optional plasma treatment step as described below. Not intending to be limiting in any sense, this illustration describes an example of embodiments where the gas introduced by the exposure to the reagent 110 selectively reacts with the layer containing the metal oxychloride 108 but not with the metal oxide containing film 100 or the non-metal oxide portion of substrate 102.

After exposing to the vapor 110, the process chamber holding the substrate 102 may be purged with an inert gas. In a purge process, the substrate 102 may be exposed to a stream of inert gas such as helium (He), argon (Ar), or nitrogen ($N_2$). In some embodiments, the process chamber may be evacuated instead of purging. Still in certain embodiments, both purging and evacuation may be performed together or in a sequence. This purge/evacuation process may remove any remaining vapor 110 and the volatile products 112.

In certain embodiments, an optional treatment with plasma may be performed after exposing the substrate 102 to the vapor 110 as a part of the ALE process. This may dissociate surface species from the substrate by ion bombardment. The plasma treatment includes exposing the substrate to a gas containing plasma, which may comprise ionized inert gas molecules of helium (He), argon (Ar), or nitrogen ($N_2$). The system may be heated or cooled during the plasma treatment step. The plasma treatment may also be carried out under at a reduced pressure, wherein the pressure may be kept between 10 Torr and 40 Torr, between 0.1 Torr and 20 Torr, or between $10^{-5}$ Torr and 1 Torr.

When the layer containing the metal oxychloride 408 is removed, a new layer of the metal oxide containing film 100 is exposed on the surface, which is ready for a next cycle of etching. Accordingly, continued cycles of the surface modification and removal steps as described above may be carried out for further etching of the material. In principle, although not wishing to be limited by any theory, each step is expected to be self-limiting and at each cycle only a monolayer or a few layers of material are removed, providing the ability to realize the atomic-scale etching control. Subsequent cycles may be repeated until a target thickness of the metal oxide containing film 100 is removed. In other words, the steps of FIGS. 1B and 1C may be repeated for multiple cycles.

In certain embodiments, the sequence of steps of ALE process may be separated temporally in the same zone in a chamber or spatially in different zones in the same chamber. Embodiment systems that realize these different methods of separation will be further described more in the later sections.

A variety of ligand-exchange reagents not containing fluorine may be used in the removal step. In certain embodiments, the ligand-exchange reagent is a boron-containing reagent. In some other embodiments, the ligand-exchange reagent is a nitrogen-containing reagent. Still in some embodiments, the ligand-exchange reagent is an alcohol, carboxylic acid, carboxamide, or beta-diketone. Still in some embodiments, the ligand-exchange reagent is an adduct of aluminum hydride with a nitrogen containing adduct ligand. Details of examples with different ligand-exchange reagents are described further in later sections.

In certain embodiments, the ligand-exchange reagent is a borane reagent. The borane reagent comprises a first ligand, a second ligand, and a third ligand, the first ligand is a hydrogen ligand, an alkyl ligand, or a dialkylamide ligand, the second ligand is a hydrogen ligand, an alkyl ligand, or a dialkylamide ligand, and the third ligand is a hydrogen ligand, an alkyl ligand, or a dialkylamide ligand. In other words, the borane reagent may have a general formula of BL1L2L3, wherein Lx (x=1, 2, or 3) is a hydrogen ligand, an alkyl ligand, or dialkylamide ligand. In this disclosure, a dialkylamide ligand is defined as a ligand having a general formula of NR1R2, where Rx (x=1 or 2) is an alkyl ligand. If L1, L2, and L3 are equal to each other, the borane reagent is homoleptic (i.e., all ligands being same), and examples of such homoleptic reagents are borane ($BH_3$), trialkylborane such as trimethylborane and triethylborane, and tri(amino) borane complex such as tris(dimethylamino)borane, tris (ethylmethylamino)borane, and tris(diethylamino)borane. The borane reagent may be heteroleptic having at least one different ligand from another. Examples of such heteroleptic reagents are ethyl(methyl)borane, ethyl(dimethyl)borane, and ethyl(isopropyl)methylborane.

In certain embodiments, the ligand-exchange reagent is an adduct of a borane reagent with a nitrogen-containing adduct ligand. Besides the adduct ligand, the borane reagent comprises a first ligand, a second ligand, and a third ligand, the first ligand is a hydrogen ligand, an alkyl ligand, or a dialkylamide ligand, the second ligand is a hydrogen ligand, an alkyl ligand, or a dialkylamide ligand, and the third ligand is a hydrogen ligand, an alkyl ligand, or a dialkylamide ligand. In other words, the borane reagent may have a general formula of ABL1L2L3, wherein A is a neutral N-containing adduct ligand such as trimethylamine, ammonia, pyridine, and Lx (x=1, 2, or 3) is a hydrogen ligand, an alkyl ligand, or dialkylamide ligand. The neutral N-containing adduct ligand may facilitate the removal of hydrochloric acid, which may be formed as a byproduct, from the surface.

In certain embodiments, the steps of ALE described in FIGS. 1B-1C may be separated temporally or spatially. Separation may be realized by purging, evacuation, transporting the substrate, or combination thereof. In certain embodiments, the steps of ALE described in FIGS. 1B-1C may be only partially separated and they may partially overlap.

Figure 2:
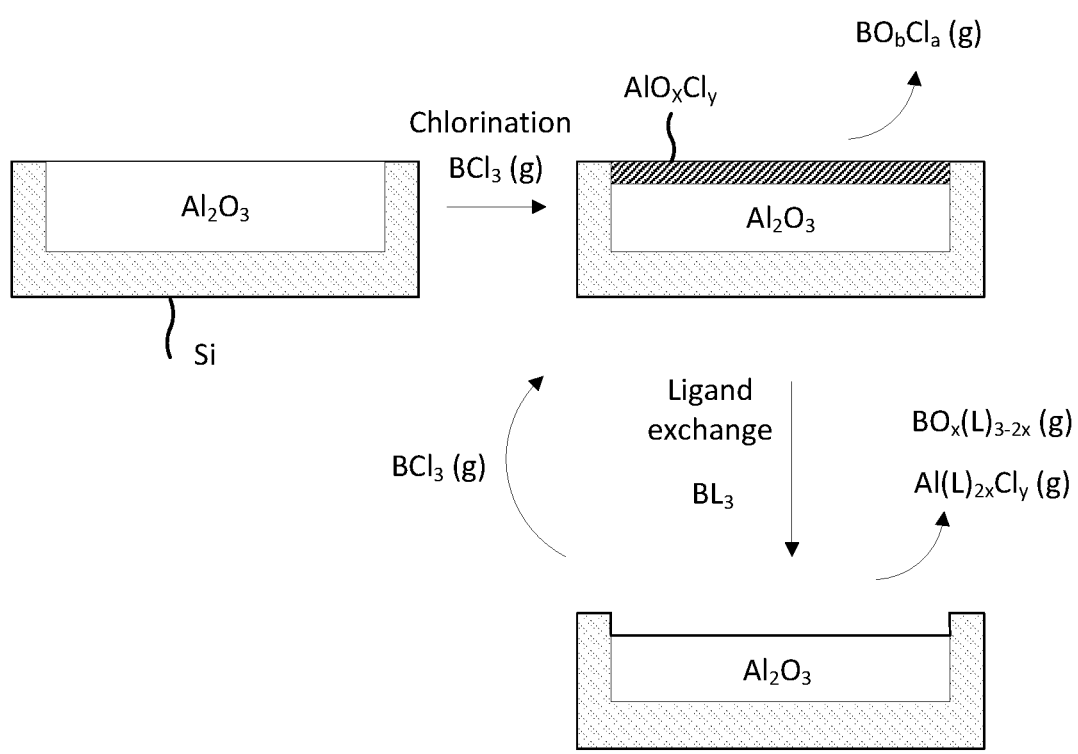
FIG. 2 illustrates the change of surface chemical composition and removal of volatile products in an example of ALE etching of aluminum oxide ($Al_2O_3$) using boron trichloride ($BCl_3$) in the surface modification step and a borane reagent in the removal step in accordance with an embodiment.

FIG. 2 illustrates the change of surface chemical composition in an example of selective aluminum oxide ($Al_2O_3$) etching according to an embodiment of the disclosure. A gas comprising $BCl_3$ is used in the surface modification step and a gas comprising a homoleptic borane reagent $BL_3$, wherein L is an alkyl ligand or dialkylamide ligand, is used in the removal step in accordance with an embodiment. In this example, the substrate further comprises a silicon (Si) wafer and a portion of the Si wafer is also exposed on the surface as illustrated in FIG. 2. Upon the exposure to the gas comprising $BCl_3$, chlorination proceeds at a surface layer of $Al_2O_3$. The reaction yields a thin layer of aluminum oxychloride $AlO_xCl_y$ on the surface and volatile byproducts containing $BO_bCl_a$. The Si wafer remains essentially intact.

Here, it should be noted that the degree of chlorination in an actual process is expected to vary (i.e., $0<x<1.5$, $0<y<3$ in $AlO_xCl_y$), depending on many factors such as location on the surface, impurities on the surface, process parameters, and reactivity of the reagents. Therefore, the discussion on stoichiometry is only for example.

In the following removal step, the ligand exchange reaction is carried out upon the exposure of the substrate 102 to a second gas comprising $BL_3$, where the layer of $AlO_xCl_y$ is converted to more volatile species. The aluminum species may be expressed as $AlL_{2x}Cl_y$, assuming that every oxygen (O), which is a divalent anion, in the layer may be replaced with two monovalent ligands (L) and also no ligand exchange with chlorine occurs. An example of the possible stoichiometry that may occur during the process is presented below only for illustration purpose without intending to be limiting in any sense. In this example, x=0.5, y=2, a=b=1, with the stoichiometric numbers shown in the equations. Reacting with any residual surface OH groups on the surface, other byproducts such as water and hydrochloric acid may be formed.

$$Al_2O_3 + 2BCl_3(g) \rightarrow Al_2OCl_4 + 2BOCl(g) \quad (1)$$

$$Al_2OCl_4 + 2BL_3(g) \rightarrow 2AlLCl_2(g) + 2BO_{0.5}L_2(g) \quad (2)$$

Overall, (1)+(2): $Al_2O_3 + 2BCl_3(g) + 2BL_3(g)$
$\rightarrow 2AlLCl_2(g) + 2BOCl(g) + 2BO_{0.5}L_2(g)$ In certain embodiments, the ligand-exchange reagent is an amine reagent. The reagent may have a general formula of $NH_2R1$ or $NHR1R2$, wherein Rx (x=1 or 2) is an alkyl. Examples of the amine reagent are methylamine, dimethylamine, diethylamine, ethylmethylamine, and ethylamine.

Figure 3:
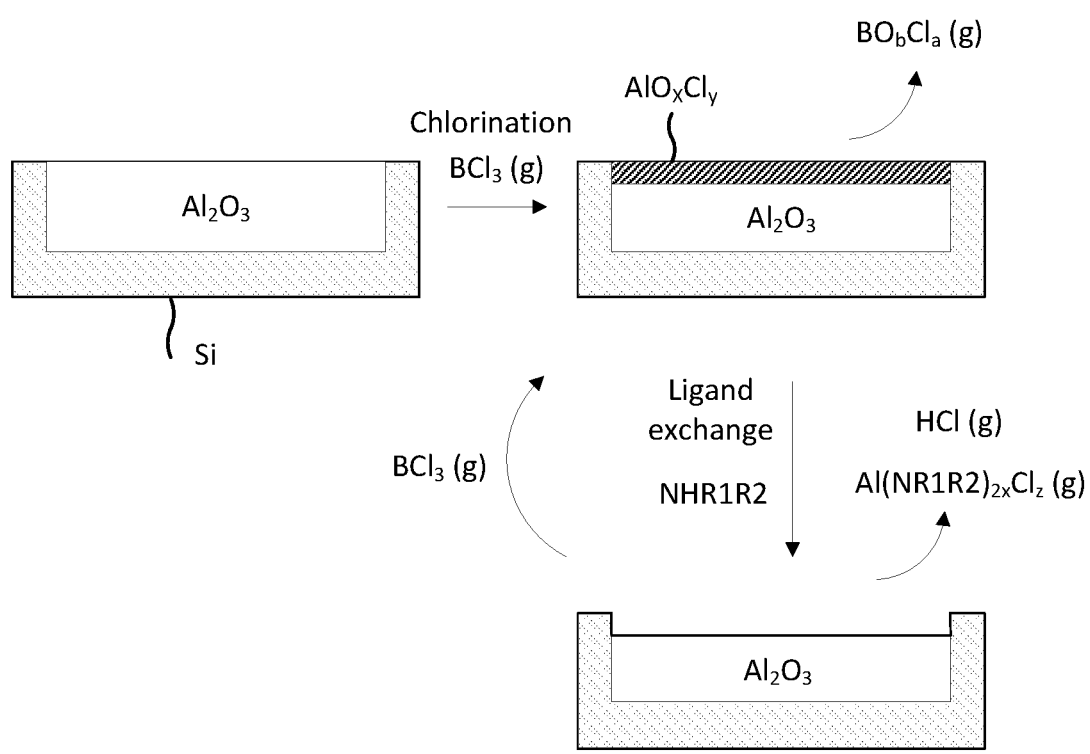
FIG. 3 illustrates the change of surface chemical composition and removal of volatile products in an example of ALE etching of aluminum oxide ($Al_2O_3$) using boron trichloride ($BCl_3$) in the surface modification step and an amine reagent in the removal step in accordance with an embodiment.

FIG. 3 illustrates the reactions in an example of selectively etching aluminum oxide ($Al_2O_3$) according to an embodiment of the disclosure. A gas comprising $BCl_3$ is used in the surface modification step and a gas comprising an amine reagent $NHR1R2$ is used in the removal step in accordance with an embodiment. In this example, the substrate further comprises a silicon (Si) wafer and a portion of the Si wafer is also exposed on the surface as illustrated in FIG. 3. The surface modification step proceeds in the same way as the example in FIG. 2 to form a layer of $AlO_xCl_y$. In the following removal step, the ligand exchange reaction is carried out upon the exposure of the substrate to a second gas comprising $NHR1R2$, where the layer of $AlO_xCl_y$ is converted to more volatile species. There are various ligands that may possibly enable the ligand exchange such as $NR1^{2-}$, $NR2^{2-}$, $NH^{2-}$, $NR1R2^-$, $NHR1^-$, and $NHR2^-$. For illustration purpose, when assuming that only $NR1R2^-$ is used for the ligand exchange, the aluminum species may be expressed as $Al(NR1R2)_{2x}Cl_z$. Other byproducts such as water and hydrochloric acid may be formed.

In certain embodiments, the ligand-exchange reagent is an alcohol reagent. The reagent may have a general formula of ROH. Examples of the alcohol reagent are methanol, ethanol, tert-butanol, isopropanol, trifluoromethanol, perfluoroethanol, perfluoro-isopropanol, and perfluoro-tert-butanol. Acidic OH groups in alcohol reagents can react with the chlorinated metal oxide surface to enable ligand exchange.

Figure 4:
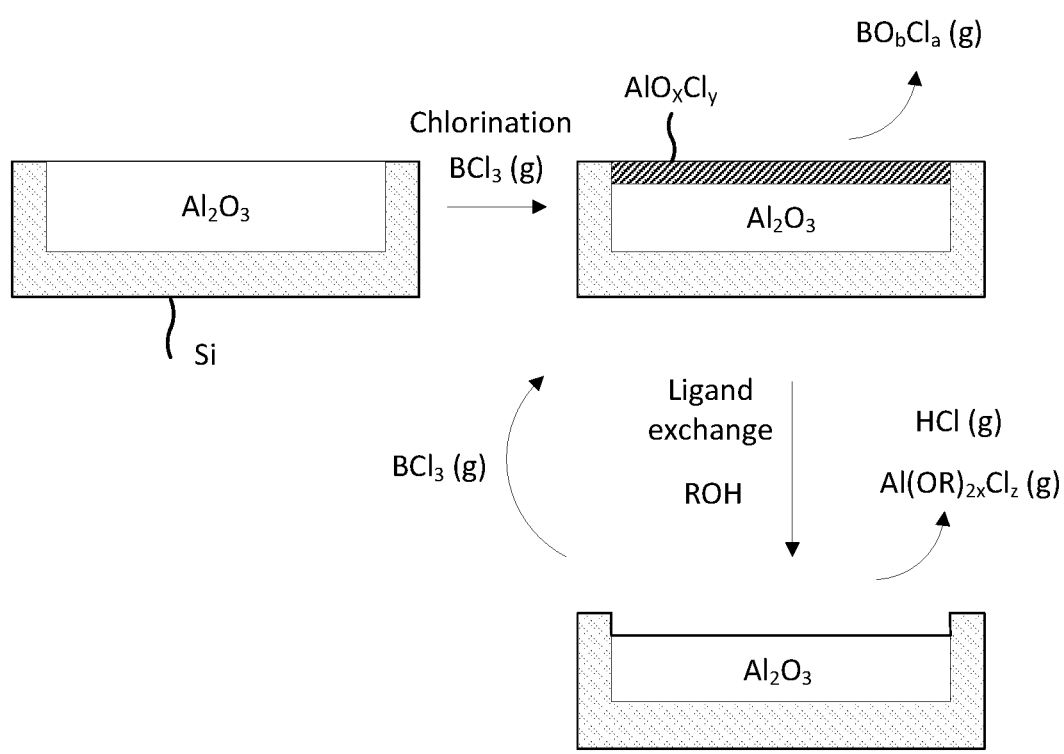
FIG. 4 illustrates the change of surface chemical composition and removal of volatile products in an example of ALE etching of aluminum oxide ($Al_2O_3$) using boron trichloride ($BCl_3$) in the surface modification step and an alcohol in the removal step in accordance with an embodiment.
Figure 5:
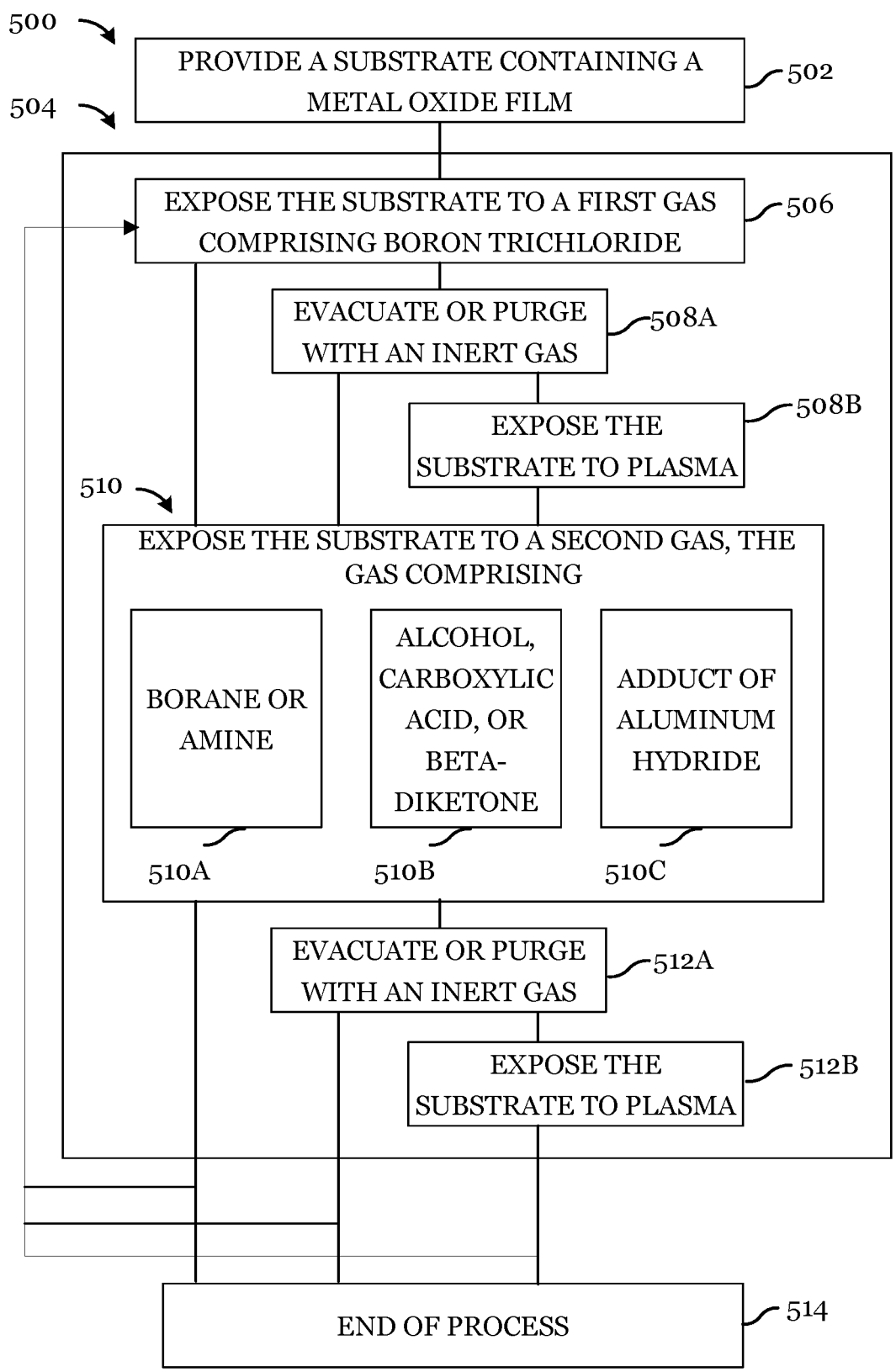
FIG. 5 is a flow chart illustrating an example process flow of a thermal ALE process on a substrate in accordance with an embodiment.

FIG. 4 illustrates the reactions in an example of selectively etching aluminum oxide ($Al_2O_3$) according to an embodiment of the disclosure. A gas comprising $BCl_3$ is used in the surface modification step and a gas comprising an alcohol reagent ROH is used in the removal step in accordance with an embodiment. In this example, the substrate further comprises a silicon (Si) wafer and a portion of the Si wafer is also exposed on the surface as illustrated in FIG. 4. The surface modification step proceeds in the same way as the example in FIG. 2 to form a layer of $AlO_xCl_y$. In the following removal step, the ligand exchange reaction is carried out upon the exposure of the substrate to a second gas comprising ROH, wherein the layer of $AlO_xCl_y$ is converted to more volatile species. Assuming that a ligand, $OR^-$, is available for exchange, the aluminum species may be expressed as $Al(OR)_{2x}Cl_z$. Other byproducts such as water and hydrochloric acid may also be formed.

In certain embodiments, the ligand-exchange reagent is a carboxylic acid reagent. The reagent may have a general formula of RCOOH. Examples of the carboxylic acid reagent are acetic acid, ethanoic acid, and trifluoroacetic acid. Similar to the embodiments with alcohols, acidic OH group in carboxylic acid reagents can react with the chlorinated metal oxide surface to enable ligand exchange.

In certain embodiments, the ligand-exchange reagent is a carboxamide reagent. The reagent may have a general formula of R1C(O)NR2R3, where in Rx (x=1, 2, or 3) is a hydrogen or alkyl. Examples of the carboxamide reagent are acetamide and dimethylformamide.

In certain embodiments, the ligand-exchange reagent is a beta-diketone reagent. The reagent may have a general formula of R1C(O)CR2R3C(O)R4, wherein R1 is an alkyl, R2 is a hydrogen or alkyl, R3 is a hydrogen or alkyl, and R4 is an alkyl. Examples of the beta-diketone reagent are acetylacetone and hexafluoroacetylacetone. Beta-diketone can exist in keto and enol forms due to tautomerism. An OH group is present in the enol form of a beta-diketone. Accordingly, similar to the embodiments with alcohols and carboxylic acids, acidic OH group in the beta-diketone reagents can react with the chlorinated metal oxide surface to enable ligand exchange. Other byproducts such as water and hydrochloric acid may also be formed.

In certain embodiments, the ligand-exchange reagent is an adduct of aluminum hydride with a nitrogen containing adduct ligand. An example is $(Me3N)AlH_3$.

In certain embodiments, during the surface removal step using a gas stream comprising an amine reagent, an alcohol reagent, a carboxylic acid reagent, a carboxamide reagent, a beta-diketone reagent, or an adduct of aluminum hydride with a nitrogen containing adduct ligand, a neutral N-containing reagent such as trimethylamine, ammonia, and pyridine, may optionally be added to the second gas to facilitate the removal of hydrochloric acid from the surface, which may be formed as a byproduct. Alternatively, in certain embodiments, the exposure to the neutral N-containing reagent may be conducted in a separate step. The neutral N-containing reagent may be pulsed into a flow of inert gas at a fixed rate.

Compared to common techniques using fluorine-containing precursors as a primary reagent, the use of $BCl_3$ in the first step may be advantages for several reasons without wishing to be limited by any theory. First, the oxophilicity of boron may be helpful to bind with oxygen of metal oxide, which may be an issue in other reagents. Second, most metal chlorides tend to be more volatile than corresponding fluorides. The chlorination-based approach may therefore realize a faster etch rate of metal oxide species. Furthermore, fluorine-containing reagents may have high reactivity with silicon species and others. ALE techniques primarily relying on fluorination may be problematic in complex systems that may need selective etching of materials without severely damaging fluorine-sensitive materials such as silicon species. Embodiments of the present application advantageously enable the use of fluorine-sensitive materials without damaging these materials or their surfaces.

FIG. 5 illustrates an ALE process flow diagram 500 for processing a substrate in accordance with an embodiment. In one embodiment, the process flow 500 comprises loading the substrate comprising a metal oxide containing film to be etched in a process chamber (block 502). For example, the substrate 102 was described in FIG. 1A.

The process flow 500 further comprises performing etching process, e.g., atomic layer etching, that comprises a plurality of cyclic processes (block 504). Each of the plurality of cyclic processes comprises exposing the metal oxide containing film to a first gas stream comprising boron trichloride ($BCl_3$) (block 506) and exposing the metal oxide containing film to a second gas stream comprising a ligand-exchange reagent (block 510), for example, as described with respect to FIGS. 1B and 1C. In certain embodiments, the second gas may comprise a borane or amine reagent (block 510A), for example, as described with respect to FIGS. 2 and 3, respectively. In some embodiments, the second gas may comprise an alcohol, a carboxylic acid, a carboxamide, or a beta-diketone reagent (block 510B), for example, as described with respect to FIG. 4. Still in some embodiments, the second gas may comprise an adduct of aluminum hydride with a nitrogen containing adduct ligand (block 510C).

In certain embodiments, each of the plurality of cyclic processes further comprises a step of purge/evacuation (blocks 508A and 512A). In this step, purging with a stream of an inert gas, evacuation, or both is carried out. This step may be performed after the exposure to the first gas (block 506), the exposure to the second gas (block 510), or both.

In certain embodiments, each of the plurality of cyclic processes further comprises a step of exposing the substrate to a plasma (blocks 508B and 512B). This plasma treatment step may be performed after the purge/evacuation in the first step (block 508A), the purge/evacuation in the second step (block 512A), or both. Still in some embodiments, the purging and the plasma treatment may be performed together as a single step under the same process conditions (i.e., combining blocks 508A and 508B, and blocks 512A and 512B, respectively).

A plurality of cyclic processes (block 504) may be repeated to achieve a desired level of etching and the process may be complete (block 514). The conditions for each of the plurality of cyclic processes, including but not limited to temperature, pressure, exposure time, type of reagents, and the gas composition, may be varied at each step.

In certain embodiments, each of the plurality of cyclic processes may start from the exposure to the second gas (block 510) or the purge/evacuation in the second step, instead of starting from the exposure to the first gas (block 506).

In certain embodiments, a separate oxidation step (not shown) may be performed as a pretreatment step before the exposure to the first gas stream (block 506). This oxidation step may comprise exposing the substrate to a gas stream comprising an oxidative gas. In some embodiments, the oxidative gas comprises oxygen or ozone. This additional step may be advantageous when etching non-oxide materials (e.g., W), where the target element may be partially oxidized on the surface first to an oxide that may be easier to etch in the second step than the initial state.

Figure 6:
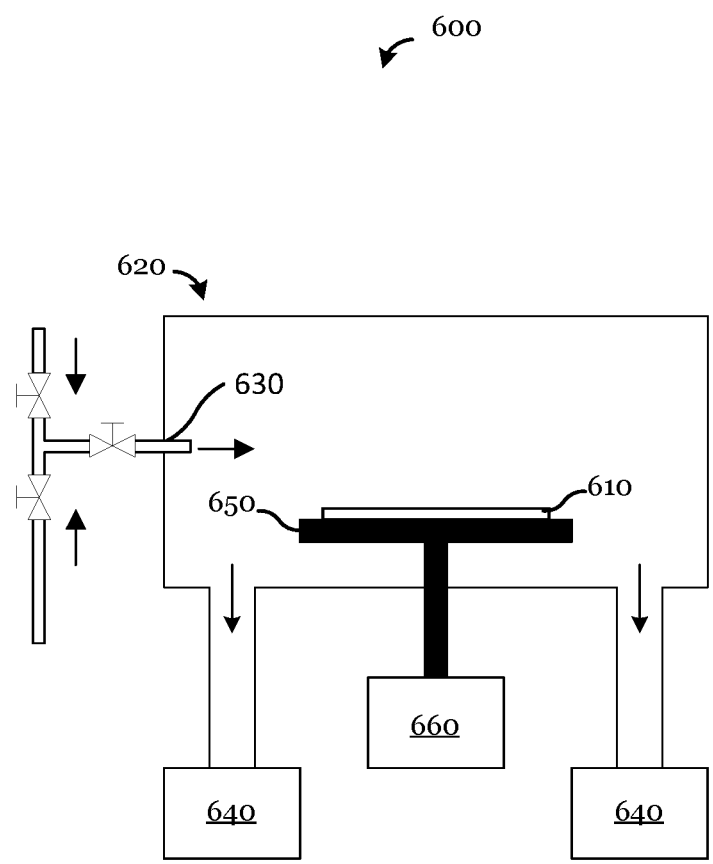
FIG. 6 illustrates a ALE processing tool in accordance with an embodiment of the present application.

FIG. 6 illustrates an ALE processing tool 100 comprising a processing chamber 620 connected to a gas delivery system 630 and a vacuum pump system 640. Gases may be introduced into the processing chamber 620 through the gas delivery system 630. The gas delivery system 630 may have a plurality of gas inlets that allows introducing a gas mixture, e.g., in a symmetric way around the processing chamber 620 (although only one inlet is schematically shown).

A substrate 610, e.g., a semiconductor wafer to be processed, may be mounted on a substrate holder 6504 inside the processing chamber 620. In one or more embodiments, the substrate 610 comprises one or more layers of metal oxide. The substrate holder 650 may be a circular electrostatic chuck, and it may have the ability to rotate the substrate 610. Optionally, the substrate 610 may be maintained at a desired process temperature, for example by a temperature controller 660 coupled to the substrate holder 650. The processing chamber 620 may include other equipment and devices, for example, optional lamps or heating elements to heat the substrate 610. Alternately, one or more of the gases may be preheated while introducing into the processing chamber 620.

The ALE processing tool may further comprise a quartz crystal microbalance (QCM) for accurately determination of the mass change on a surface during the process (not shown).

The configuration of ALE processing system 100 described above is by example only. In certain embodiments, the processing chamber 620 may be configured to contain and process vertically or horizontally a plurality of substrates in a single operation. In alternative embodiments, various alternative configurations may be used including plasma processing equipment. For example, inductively coupled plasma (ICP) tools, capacitively coupled plasma (CCP), helical resonators may be used where some steps of the ALE process is performed without the plasma.

Figure 7:
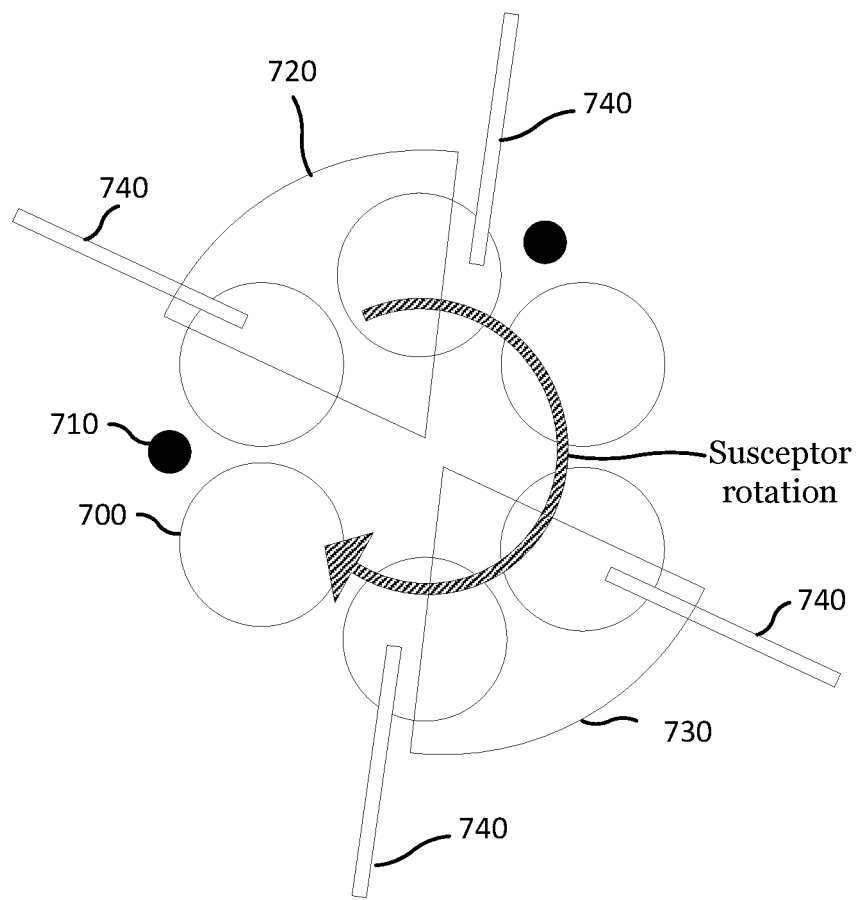
FIG. 7 illustrates a rotational susceptor for ALE processing in accordance with an embodiment.

FIG. 7 is a schematic illustrating a rotational susceptor for ALE processing that may be used to achieve spatial separation of ALE steps in the method in accordance with an embodiment.

The susceptor has a plurality of stages 700 to hold a plurality of substrates. One or more exhaust outlet 710 and gas inlet 740 are located between and above some of the stages 700, respectively. This design allowed a plurality of treatment zones (e.g., 720 and 730) in the same chamber. In this configuration or the like, different treatment steps may be carried out in different zones in the chamber while spatial separation between the zones is achieved by evacuating with the exhaust 710 or purging with the inlet 740. By rotating the susceptor at a controlled rate, each stage is exposed to sequential steps of ALE process in accordance with embodiments. In certain embodiments, a section of the susceptor (e.g., 720) may be used to perform the surface modification step and another section (e.g., 730) to perform the removal step. With evacuating or purging, contamination between the zones may be prevented. The duration of steps of ALE process may be controlled by adjusting the size of treatment zones and controlling the rotational speed. This mode of operation allows ALE process to continue without purging or evacuating the entire process chamber. The configuration of the rotational susceptor described above is by example only.

Example embodiments of the invention are summarized here. Other embodiments can also be understood from the entirety of the specification as well as the claims filed herein.

Example 1

A method of processing a substrate includes loading the substrate in a process chamber, where the substrate includes a metal oxide containing film to be etched. The method further includes performing of an atomic layer etching including a plurality of cyclic processes, each of the plurality of cyclic processes including exposing the metal oxide containing film to a first gas stream including boron trichloride (BCl3), and exposing the metal oxide containing film to a second gas stream including a borane reagent or an amine reagent.

Example 2

The method of example 1, further including removing the first gas stream from the process chamber before exposing the metal oxide containing film to the second gas stream.

Example 3

The method of one of examples 1 or 2, further including removing the second gas stream from the process chamber before starting a next cycle of the plurality of cyclic processes.

Example 4

The method of one of examples 1 to 3, where the process chamber includes a first zone with the first gas stream and a second zone with the second gas stream, the method further including transporting the substrate from the first zone to the second zone after exposing the metal oxide containing film to the first gas stream.

Example 5

The method of one of examples 1 to 4, further including a purge zone located between the first zone and the second zone, the purge zone including a third gas stream including an inert gas.

Example 6

The method of one of examples 1 to 5, where the borane reagent includes a first ligand, a second ligand, and a third ligand, the first ligand is a hydrogen ligand, an alkyl ligand, or a dialkylamide ligand, the second ligand is a hydrogen ligand, an alkyl ligand, or a dialkylamide ligand, and the third ligand is a hydrogen ligand, an alkyl ligand, or a dialkylamide ligand, and where the second gas stream includes the borane reagent without any of the amine reagent.

Example 7

The method of one of examples 1 to 6, where the borane reagent is a trialkylborane reagent.

Example 8

The method of one of examples 1 to 7, where the borane reagent is trimethylborane or triethylborane.

Example 9

The method of one of examples 1 to 8, where the borane reagent includes tris(dimethylamino)borane, tris(ethylmethylamino)borane, or tris(diethylamino)borane.

Example 10

The method of one of examples 1 to 9, where the borane reagent further includes a neutral nitrogen containing adduct ligand.

Example 11

The method of one of examples 1 to 10, where the amine reagent includes hydrogen, nitrogen, a first ligand, and a second ligand, the first ligand is a hydrogen ligand or an alkyl ligand, the second ligand is an alkyl ligand, and where the second gas stream includes the amine reagent without any of the borane reagent.

Example 12

The method of one of examples 1 to 11, where the amine reagent a dialkylamine.

Example 13

The method of one of examples 1 to 12, where the amine reagent a dimethylamine, diethylamine, or ethylmethylamine.

Example 14

The method of one of examples 1 to 13, further including exposing the metal oxide containing film to a gas stream including a neutral N-containing reagent.

Example 15

A method of atomic layer etching (ALE) includes loading a substrate in a process chamber, the substrate including a metal oxide containing film to be etched. The method further includes exposing the substrate to a first gas stream including boron trichloride (BCl3) in a vapor phase; and exposing the substrate to a second gas stream including an alcohol, carboxylic acid, a carboxamide, or beta-diketone reagent.

Example 16

The method of example 15, where the alcohol includes methanol, ethanol, tert-butanol, isopropanol, trifluoromethanol, perfluoro-ethanol, perfluoro-isopropanol, or perfluoro-tert-butanol.

Example 17

The method of one of examples 15 or 16, where the carboxylic acid includes acetic acid, ethanoic acid, or trifluoroacetic acid.

Example 18

The method of one of examples 15 to 17, where the carboxamide includes acetamide or dimethylformamide.

Example 19

The method of one of examples 15 to 18, where the beta-diketone includes acetylacetone or hexafluoroacetylacetone.

Example 20

The method of one of examples 15 to 19, further including exposing the metal oxide containing film to a gas stream including a neutral N-containing reagent.

Example 21

A method of processing a substrate includes loading the substrate in a process chamber, the substrate including a metal oxide containing film to be etched. The method further includes performing of a sequential etching process including a plurality of self-limiting cyclic processes, each of the plurality of self-limiting cyclic processes including converting a layer of the metal oxide containing film to a metal mixed-anion compounds including chlorine, and releasing the metal mixed-anion compounds from the rest of the metal oxide containing film to remove the layer of the metal oxide, the releasing including exposing the metal mixed-anion compounds to a first gas stream including an adduct of aluminum hydride with a nitrogen containing adduct ligand, a borane reagent, an amine reagent, a beta-diketone reagent, an alcohol, or a carboxylic acid.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    loading the substrate in a process chamber, the substrate comprising a metal oxide containing film to be etched; and
    performing an isotropic thermal atomic layer etching comprising a plurality of cyclic processes, each of the plurality of cyclic processes comprising
        exposing the metal oxide containing film to a first gas stream comprising boron trichloride ($BCl_3$) to modify a metal oxide containing outer surface of the metal oxide containing film, and
        exposing the modified metal oxide containing outer surface of the metal oxide containing film to a second gas stream comprising a borane reagent or an amine reagent to remove the modified metal oxide containing outer surface and expose a new metal oxide containing outer surface of the metal oxide containing film.

2. The method of claim 1, further comprising:
    removing the first gas stream from the process chamber before exposing the metal oxide containing outer surface of the metal oxide containing film to the second gas stream.

3. The method of claim 1, further comprising:
    removing the second gas stream from the process chamber before starting a next cycle of the plurality of cyclic processes.

4. The method of claim 1, wherein the first gas stream or the second gas stream is essentially fluorine-free.

5. The method of claim 1, further comprising exposing the modified metal oxide containing outer surface of the metal oxide containing film to a plasma generated from a third gas stream comprising dinitrogen (N2), argon (Ar), or helium (He).

6. The method of claim 1, wherein the process chamber comprises a first zone with the first gas stream and a second zone with the second gas stream, the method further comprising transporting the substrate from the first zone to the second zone after exposing the metal oxide containing film to the first gas stream.

7. The method of claim 6, wherein the process chamber further comprises a purge zone located between the first zone and the second zone, the purge zone comprising a third gas stream comprising an inert gas, the method further comprising purging the substrate with the third gas stream in the purge zone.

8. The method of claim 1, wherein the borane reagent comprises a first ligand, a second ligand, and a third ligand, the first ligand is a hydrogen ligand, an alkyl ligand, or a dialkylamide ligand, the second ligand is a hydrogen ligand, an alkyl ligand, or a dialkylamide ligand, and the third ligand is a hydrogen ligand, an alkyl ligand, or a dialkylamide ligand, and wherein the second gas stream comprises the borane reagent without any of the amine reagent.

9. The method of claim 8, wherein the borane reagent is a trialkylborane reagent.

10. The method of claim 8, wherein the borane reagent comprises tris(dimethylamino)borane, tris(ethylmethylamino)borane, or tris(diethylamino)borane.

11. The method of claim 8, wherein the borane reagent further comprises a neutral nitrogen containing adduct ligand.

12. The method of claim 1, wherein the amine reagent comprises hydrogen, nitrogen, a first ligand, and a second ligand, the first ligand is a hydrogen ligand or an alkyl ligand, the second ligand is an alkyl ligand, and wherein the second gas stream comprises the amine reagent without any of the borane reagent.

13. The method of claim 12, wherein the amine reagent a dialkylamine.

14. The method of claim 12, further comprising exposing the metal oxide containing film to a gas stream comprising a neutral N-containing reagent.

15. A method of atomic layer etching (ALE), the method comprising:
- loading a substrate in a process chamber, the substrate comprising a metal oxide containing film to be etched; and
- performing an isotropic thermal etching comprising:
  - heating the substrate to a process temperature for the isotropic thermal etching;
  - exposing the heated substrate to a first gas stream comprising boron trichloride ($BCl_3$) in a vapor phase to modify a metal oxide containing outer surface of the metal oxide containing film; and
  - exposing the heated substrate to a second gas stream comprising an alcohol, carboxylic acid, a carboxamide, or beta-diketone reagent to remove the modified metal oxide containing outer surface and expose a new metal oxide containing outer surface of the metal oxide containing film.

16. The method of claim 15, wherein the alcohol comprises methanol, ethanol, tert-butanol, isopropanol, trifluoromethanol, perfluoro-ethanol, perfluoro-isopropanol, or perfluoro-tert-butanol.

17. The method of claim 15, wherein the carboxylic acid comprises acetic acid, ethanoic acid, or trifluoroacetic acid.

18. The method of claim 15, wherein the carboxamide comprises acetamide or dimethylformamide.

19. The method of claim 15, wherein the beta-diketone comprises acetylacetone or hexafluoroacetylacetone.

20. The method of claim 15, further comprising exposing the metal oxide containing film to a gas stream comprising a neutral N-containing reagent.

21. A method of processing a substrate, the method comprising:
- loading the substrate in a process chamber, the substrate comprising a metal oxide containing film to be etched; and
- performing of an isotropic thermal atomic layer etching (ALE) process comprising a plurality of self-limiting cyclic processes, each of the plurality of self-limiting cyclic processes comprising
  - converting a layer of the metal oxide containing film to a metal mixed-anion compounds comprising chlorine, and
  - releasing the metal mixed-anion compounds from the rest of the metal oxide containing film to remove the layer of the metal oxide, the releasing comprising exposing the metal mixed-anion compounds to a first gas stream comprising an adduct of aluminum hydride with a nitrogen containing adduct ligand, a borane reagent, an amine reagent, a beta-diketone reagent, an alcohol, or a carboxylic acid.

* * * * *